US006940436B2

(12) United States Patent
Hezar et al.

(10) Patent No.: US 6,940,436 B2
(45) Date of Patent: Sep. 6, 2005

(54) ANALOG-TO-DIGITAL CONVERSION SYSTEM WITH SECOND ORDER NOISE SHAPING AND A SINGLE AMPLIFIER

(75) Inventors: Rahmi Hezar, Plano, TX (US); Oguz Altun, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/698,830

(22) Filed: Oct. 31, 2003

(65) Prior Publication Data

US 2005/0093726 A1 May 5, 2005

(51) Int. Cl.$^7$ ............................................. H03M 3/00
(52) U.S. Cl. ........................................ 341/143; 341/144
(58) Field of Search ............................. 341/143, 144, 341/145

(56) References Cited

U.S. PATENT DOCUMENTS

| | | | |
|---|---|---|---|
| 5,065,157 A | 11/1991 | Ribner et al. | |
| 5,103,229 A | 4/1992 | Ribner | |
| 5,181,032 A | 1/1993 | Ribner | |
| 5,305,004 A | 4/1994 | Fattaruso | |
| 6,473,019 B1 * | 10/2002 | Ruha et al. | 341/143 |
| 6,611,221 B1 | 8/2003 | Soundarapandian et al. | |
| 6,697,004 B1 * | 2/2004 | Galton et al. | 341/144 |
| 6,707,409 B1 * | 3/2004 | Ignjatovic et al. | 341/143 |
| 6,710,729 B1 * | 3/2004 | Chen | 341/143 |

OTHER PUBLICATIONS

"A Direct Digital Synthesizer with a tunable Error Feedback Structure", Jouko Jankka, IEEE Transactions on Communications, vol. 45, No. 4, Apr., 1997, pp. 416-420.
"A Noise-Shaping Coder Topology for 15+ Bit Converters", L. Richard Carley, IEEE Journal of Solid-State Circuits, vol. 24, No. 2, Apr., 1989, pp. 267-273.
"Multibit E-Δ A/D Converter Incorporating A Novel Class of Dynamic Element Matching Techniques", Bosco H. Leung and Schat Sutarja, IEEE Transactions on Circuits and Systems, Analog and Digital Signal Processing, vol. 39, No. 1, Jan., 1992, pp. 35-51.
"A 1.5V 2.4/2.9mW 79/50dB DR Sigma Delta Modulator for GSM/WCDMA in a 0.13um Digital Process", G. Gomez and B. Haroun, *Solid State Circuits Conference, Digest of Technical Papers*, vol. 1, pp. 306-307, Feb. 2002 San Francisco, CA, and Visuals Supplement, pp. 242, 243, 490. Institute of Electrical and Electronics Engineers, 2002 Digest of Technical Papers and Visuals Supplement 2002 to the Digest of Technical Papers, IEEE International Solid-State Circuits conference, Vol. Forty-Five, ISSN 0193-6530, 13.3 "A Dual-Mode 80MHz Bandpass ΔΣ Modulator for a GSM/WCDMA IF-Receiver" T. Salo, T. Hollman, S. Lingfors and K. Halonen, 7 pgs.
"Behavioral Modeling of Seitched-Capacitor Sigma-Delta Modulators", Piero Malcovati, Simona Brigati, Fabrizio Francesconi, Franco Maloberti, Paolo Cusianato and Andrea Baschirotto, IEEE Transactions on Circuits and Systems; Fundamental Theory and Applications, vol. 50, No. 3, Mar., 2003, pp. 352-364.

* cited by examiner

Primary Examiner—Peguy JeanPierre
Assistant Examiner—Joseph Lauture
(74) Attorney, Agent, or Firm—Wade James Brady, III; Frederick J. Telecky, Jr.

(57) ABSTRACT

A analog-to-digital converters and second order noise shaping systems are presented for providing a noise shaped analog feedback signal to a A/D converter in an analog-to-digital conversion system. The noise shaping system comprises a first order integrator having a single amplifier, and a digital error feedback system comprising a digital signal processing system, in which the digital error feedback system provides an analog feedback signal to the A/D converter with second order noise shaping with respect to a quantization error associated with the A/D converter.

24 Claims, 11 Drawing Sheets

ANALOG-TO-DIGITAL CONVERSION SYSTEM WITH SECOND ORDER NOISE SHAPING AND A SINGLE AMPLIFIER

FIELD OF INVENTION

The present invention relates generally to data conversion systems and more particularly to a single amplifier analog-to-digital converter with second order noise shaping.

BACKGROUND OF THE INVENTION

Analog-to-digital (A/D) converters are electrical circuit devices that convert continuous signals, such as voltages or currents, from the analog domain to the digital domain where the signals are represented by numbers. A variety of A/D converter types exist, including flash A/Ds, sub-ranging A/Ds, successive approximation A/Ds, and integrating A/Ds. Another type is known as a sigma delta or delta sigma (e.g., Δ-Σ) A/D converter that includes a sigma delta modulator operating as a type of noise shaping encoder, typically with a 1–3 bit quantized digital output. Delta sigma (e.g., Δ-Σ) or sigma delta modulators are often used in mixed signal integrated A/D converters, because of their insensitivity to CMOS process linearity and matching problems when compared to other A/D converter types. These features make Δ-Σ based mixed signal solutions very attractive for a number of applications, such as audio, receiver channels of communication devices (wireless in particular), sensor interface circuits and measurement systems.

Delta sigma converters are operated at a significantly higher sampling rate than the bandwidth of the analog input signal, a technique referred to as oversampling, wherein the analog input signal is sampled at a very high sampling rate in order to perform a noise shaping function. The oversampling is commonly performed at a multiple of the Nyquist rate ($F_N$) for a given input signal frequency content (e.g., sampling frequency $F_S$ is often 10 to 1000 times $F_N$), wherein quantization noise power is spread over a bandwidth equal to the sampling frequency. Noise shaping filters, typically integrators, are commonly provided in the forward signal path of the delta sigma modulator. Digital filtering is performed on the oversampled digital output to achieve a high resolution, and decimation is employed to reduce the effective sampling rate back to the "Nyquist" rate.

A conventional second order delta sigma modulator 2 is illustrated in FIG. 1, comprising first and second analog adder/integrators 4 and 6, respectively. The first adder/integrator 4 comprises a first summing junction 12 and a first integrator (e.g., low pass filter) 16, and the second adder/integrator 6 comprises a second summing junction 18 and an integrator filter 22. The first summing junction 12 receives an analog input signal $V_{IN}$ via an input gain stage 14$i$ and a first feedback signal FB1 via a feedback gain stage 14$f$ from a first digital-to-analog converter (DAC or D/A) 112$d$. The modulator 2 may be a continuous time modulator or the input signal $V_{IN}$ may be periodically sampled via a switching element 8. An error signal (e.g., the difference between the input and feedback signals according to the relative gains 14$i$ and 14$f$) is provided to the input of the first integrator 16, which provides an integrator output through a second input gain stage 20$i$ to the second summing junction 18. The summing junction 18 also receives a second feedback signal FB2 via a second feedback gain stage 20$f$ from a second DAC 26$b$. The second summing junction 18 provides an error signal (e.g., the difference between the integrator output signal from the first integrator 16 and the second feedback signal FB2) to the input of the second integrator filter 22.

The modulator 2 further comprises an analog-to-digital (A/D) converter or quantizer 24 receiving the output signal from the second integrator 22. The A/D converter 24 generates an n-bit quantized or digital output signal D1 . . . . Dn, where n is a positive integer. The DAC converters 26$a$ and 26$b$ provide the analog feedback signals FB1 and FB2, respectively, in accordance with the digital output D1 . . . Dn of the A/D converter 24. A digital decimation filter 28 reduces undesirable noise in the quantized digital output signal D1 . . . . Dn. The digital filter 28 acts as an anti-aliasing filter with respect to the final sampling rate and filters out higher frequency noise produced by the noise shaping process of the modulator 2. Final data reduction is performed by digitally resampling the filtered output at a lower rate using a process called decimation in the filter 28, wherein decimation removes redundant signal information introduced by the oversampling process.

According to one popular design approach, switched capacitor circuits may be used in constructing the delta sigma converter 2, for example, in the adder/integrators 4 and 6, the A/D 24, and/or the DACs 26, to facilitate integration in CMOS mixed signal fabrication processes. For instance, in the converter 2, the adder/integrators 4 and 6 are individually fabricated using an integrator amplifier (e.g., operational amplifier) and a switched capacitor circuit. The switched capacitor circuits may provide for relative gain adjustments of input signal levels by using different capacitor values and/or by grouping of series or parallel-coupled capacitors of like value, wherein the gain adjustments are shown in FIG. 1 as gain stages 14, and 20 in the first and second adder/integrators 4 and 6, respectively. Also, the DAC converters 26 may individually comprise a group of capacitors of ideally identical capacitance values, for instance, wherein the analog feedback signals FB1 and FB2 are provided by selectively coupling certain ones of the capacitors to certain reference voltages according to the quantized signal D1 . . . Dn. Similarly, the A/D converter 24 may be constructed using switched capacitor circuits.

In many modern applications, such as wireless communications products, low power consumption and low voltage operation are important design considerations for analog-to-digital converters. In the conventional converter 2, the amplifiers inside the integrators 16 and 22 are the major source of current consumption. Furthermore, amplifier non-linearity becomes more problematic as supply voltage levels are decreased. For a flash type A/D quantizer 24, if the number of levels required is relatively small, for example, 3 or 4 bits (e.g., 8 to 10 levels), the number of comparators and the corresponding power consumption can be reduced. Also, the non-linearity of the DAC converters 26 can be mitigated through dynamic element matching (DEM) techniques. Hence, the effect of DAC imperfections on the quantization noise shaping can be reduced for low voltage operation. However, the ability to significantly reduce power consumption without degrading device performance is limited. While eliminating one stage of the converter 2 may result in lower power consumption, the noise shaping performance would go from second order to first order, whereby the device performance would be worsened. Accordingly, it is desirable to reduce the power consumption of analog-to-digital converter systems, while providing adequate noise shaping.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates analog-to-digital converters and $N^{th}$ order noise shaping systems therefor, which use digital signal processing and less than N integrator amplifiers to provide analog feedback to an A/D converter that is noise shaped to an $N^{th}$ order with respect to quantization noise associated with the system A/D converters.

In accordance with an aspect of the invention, an analog-to-digital conversion system is provided, comprising a first A/D converter and a noise shaping system. The first A/D converter provides a first quantized digital output according to a system analog input and according to a noise shaped first analog feedback signal. The noise shaping system provides the first analog feedback signal according to the first digital output. The first feedback signal is noise shaped to an order N with respect to a quantization error associated with the first A/D converter, wherein the noise shaping system has less than an integer number N integrator amplifiers, wherein N is an integer greater than 1. The invention thus provides $N^{th}$ order noise shaping without the power consumption associated with N integrator amplifiers.

In one example, the noise shaping system comprises a first digital-to-analog converter (DAC), a delta sigma modulator, and a digital error feedback system, and the first DAC provides a first DAC output according to the first digital output. The delta sigma modulator provides a second digital output according to a quantization error for the first DAC (e.g., the difference between the first DAC output and the system analog input). The digital error feedback system provides the first analog feedback signal according to the second digital output, wherein the first analog feedback signal is noise shaped to order N with respect to a quantization error of the delta sigma modulator. In this example, the delta sigma modulator comprises an integrator, a second A/D converter, and a second DAC, where the integrator has less than N integrator amplifiers. The integrator provides an analog integrator output according to the first DAC output, the system analog input, the first analog feedback signal, and an analog modulator feedback signal.

The second A/D converter provides a second digital output according to the integrator output, and the second DAC provides the modulator feedback signal to the integrator according to the second digital output. In this manner, the integrator output is noise shaped by the integrator to an order N−1 with respect to a quantization error associated with the second A/D converter. The noise shaping system in this example further comprises an analog delay system coupled with the integrator and with the first A/D converter, where the analog delay system provides a delayed integrator output signal to the integrator and to the first A/D converter, such that the quantization noise of the second A/D converter is noise shaped to an order N.

The digital error feedback system may comprise a digital signal processing system coupled with the delta sigma modulator. The digital signal processing system provides a third quantized digital output according to the second digital output, wherein the third digital output is noise shaped by the digital signal processing system to order N with respect to a quantization error associated with the delta sigma modulator. The digital error feedback system further comprises a third DAC coupled with the digital signal processing system, where the third DAC provides the first analog feedback signal to the first A/D converter according to the third digital output.

In accordance with another aspect of the invention, a noise shaping system is provided to generate a noise shaped first analog feedback signal in an analog-to-digital conversion system. The noise shaping system comprises a first DAC coupled with the first A/D converter, wherein the first DAC provides a first DAC output according to a first digital output. The system further comprises a delta sigma modulator that provides a second digital output according to a difference between the first DAC output and a system analog input, and a digital error feedback system providing the first analog feedback signal to the first A/D converter according to the second digital output.

The following description and annexed drawings set forth in detail certain illustrative aspects and implementations of the invention. These are indicative of only a few of many ways in which the principles of the invention may be employed.

DETAILED DESCRIPTION OF THE INVENTION

Figure 1:
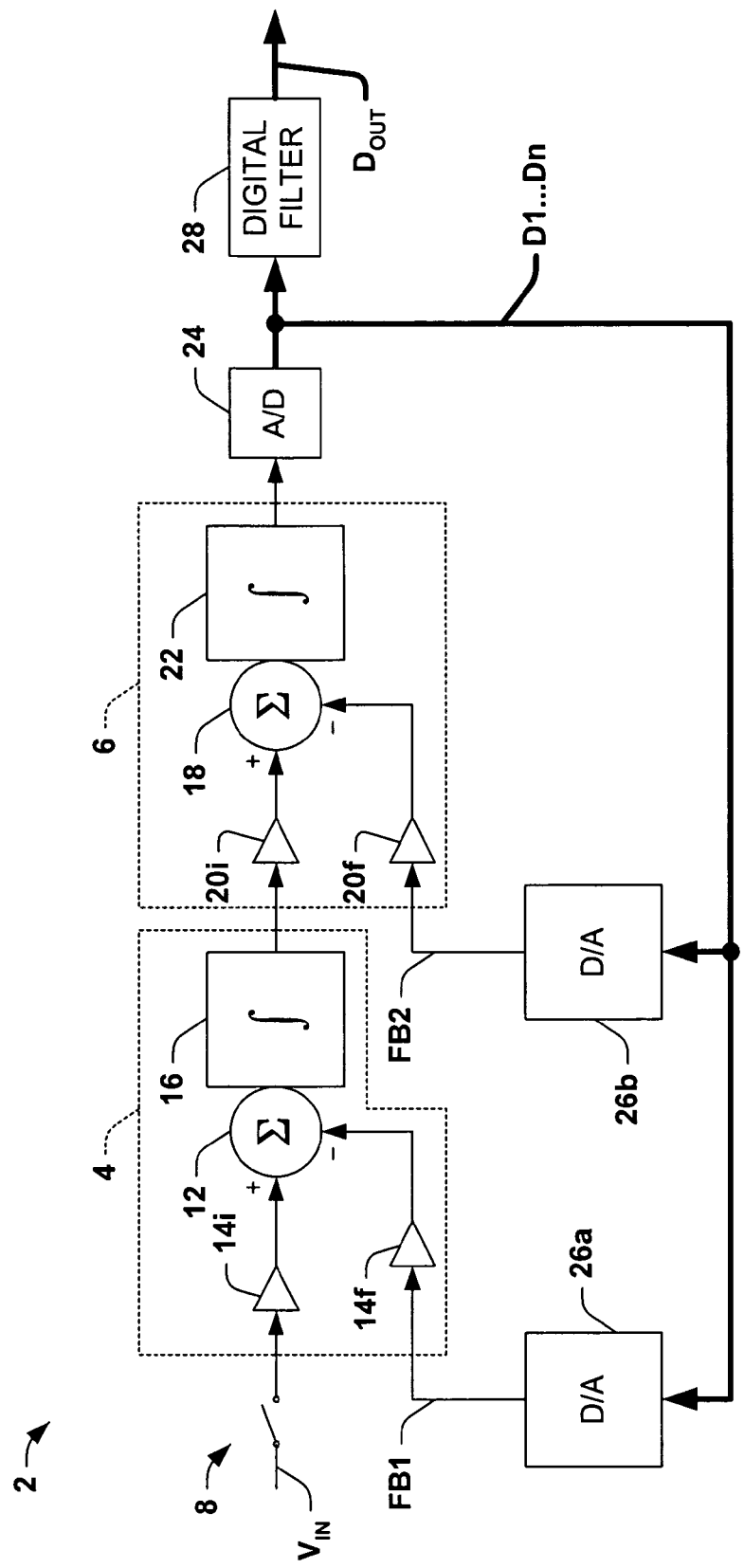
FIG. 1 is a schematic diagram illustrating a second order delta sigma A/D converter having two cascaded integrator stages.

One or more implementations of the present invention will now be described with reference to the attached drawings, wherein like reference numerals are used to refer to like elements throughout. The invention relates to second or higher order noise shaping in analog-to-digital (A/D) conversion systems, wherein noise shaping or filtering of an $N^{th}$ order is provided using less than N integrator amplifiers.

The various aspects of the invention are hereinafter illustrated in the context of an exemplary second order A/D conversion system 100 with a single integrator amplifier, wherein second order noise shaping is provided with respect to quantizers (e.g., A/D converters) in the system, using digital signal processing in a digital error feedback system. In this example, a delta sigma modulator is employed to create a digital error signal representing the quantization error of a first A/D converter. However, the invention is not limited to the illustrated examples, wherein A/D conversion systems and noise shaping systems therefor are contemplated, having noise shaping of any order N, where N is an integer greater than 1. Furthermore, while the A/D converters, DACs and other circuits are illustrated below in the context of multi-bit or multi-level digital data, single-bit implementations are also contemplated as falling within the scope of the invention.

Figure 2A:
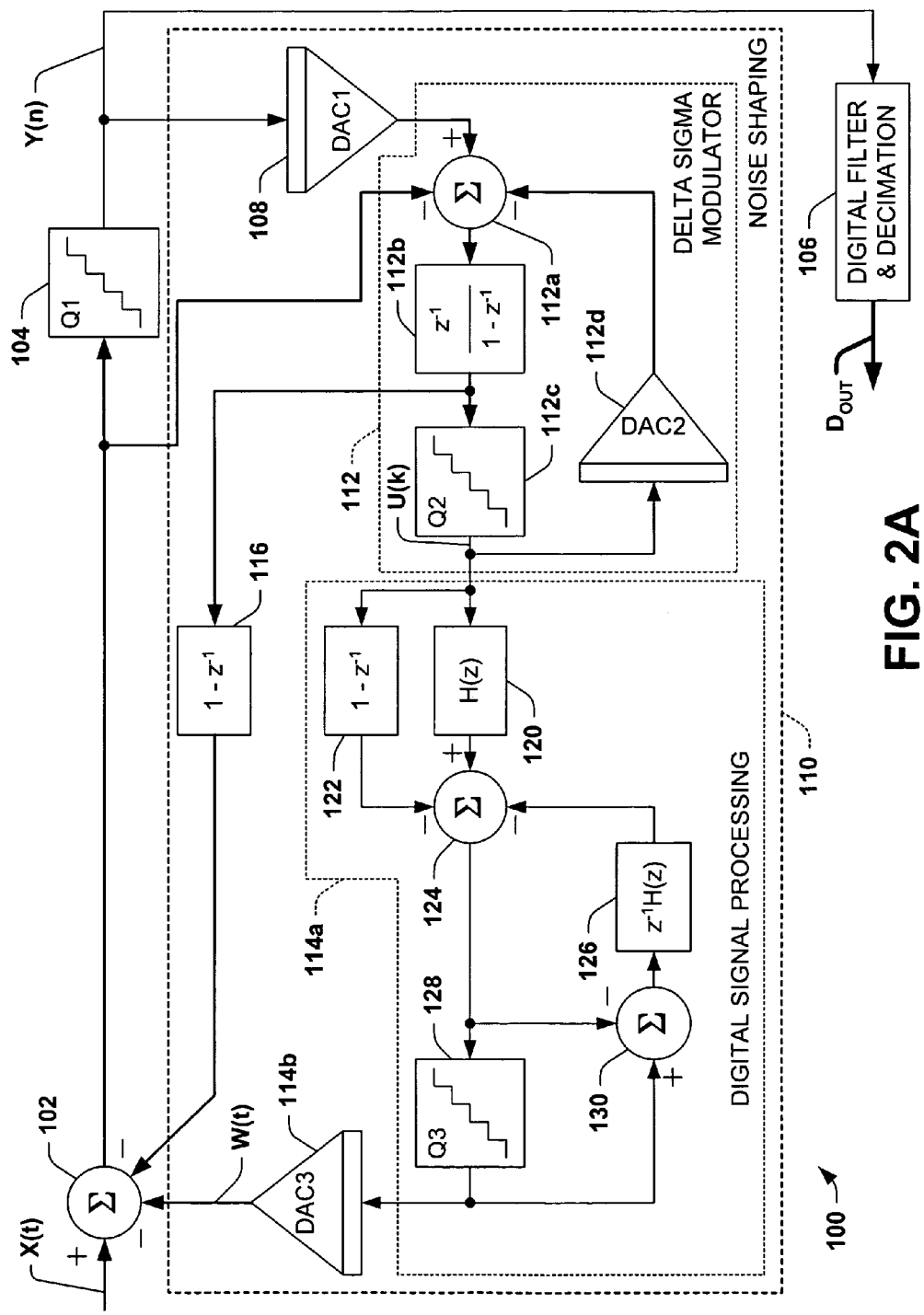
FIGS. 2A–2E are schematic diagrams illustrating an exemplary delta sigma analog-to-digital conversion system providing second order noise shaping with a single integrator amplifier in accordance with the present invention.
Figure 2B:
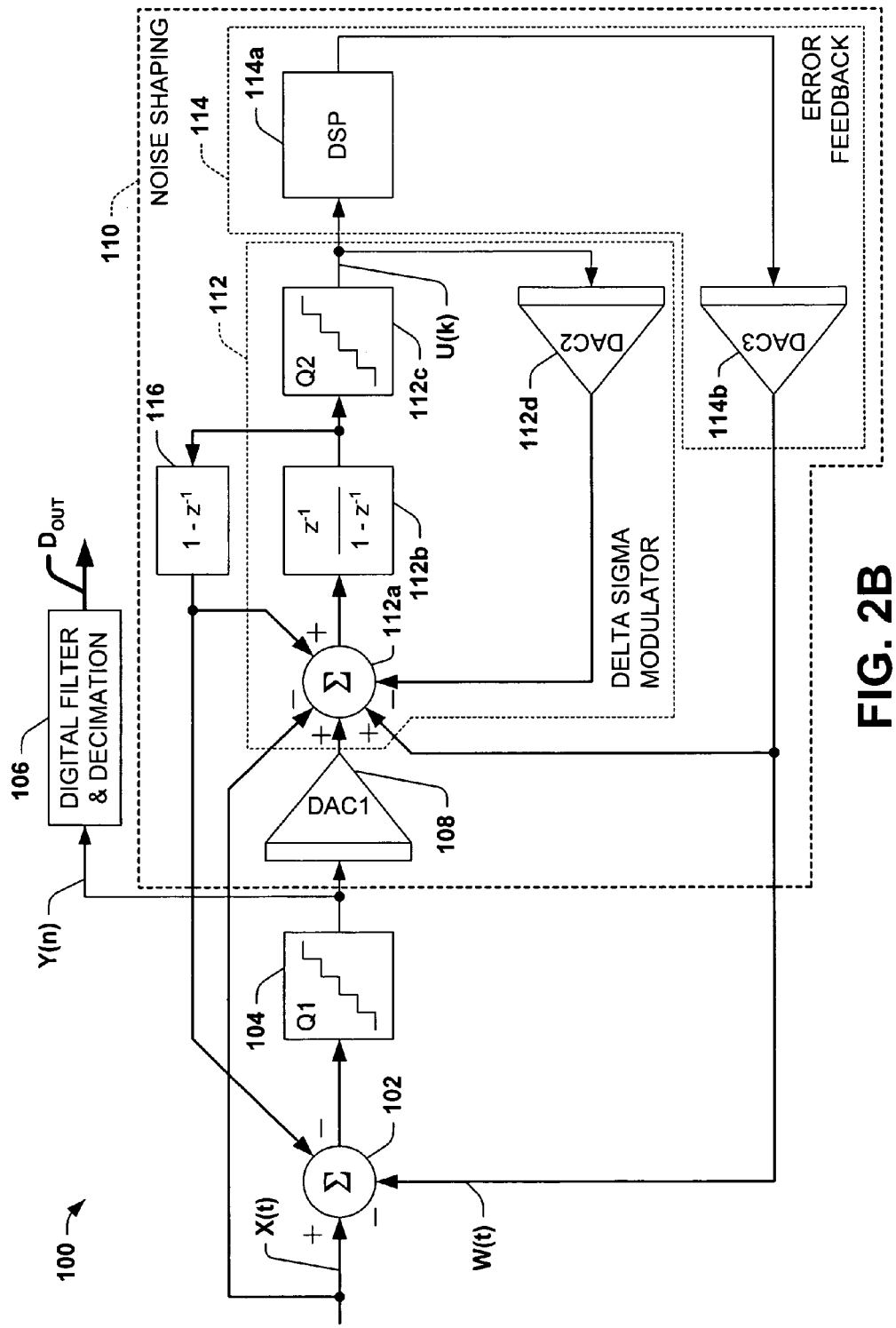

FIGS. 2A–2E illustrate an exemplary second-order noise shaping data conversion system 100 based on a single integrator and two A/D converters in accordance with the present invention, in which a digital error feedback system implements the noise transfer function (NTF) in the digital domain, and all of the quantization noises are second order shaped. FIG. 2A schematically illustrates the conversion system 100 and FIG. 2B is a reorganized illustration of the system 100 for circuit level implementation. The system 100 receives an analog input signal X (t), which can be of any amplitude and any bandwidth, and can be single-ended or differential. The system 100 converts the analog input X(t) to digital form and provides a multi-bit digital output signal $D_{OUT}$ for use in discerning and operating on information contained in the analog input X(t).

As illustrated in FIG. 2A, the system 100 receives the input signal X(t) and feedback signals at a first summer or summation node 102 in a forward signal path that also includes a first A/D converter or quantizer 104. The A/D converter 104 converts the analog signal from the summer 102 into a single or multi-bit first digital output Y(n) at a sampling rate $F_S$ that is significantly higher than the Nyquist rate for the bandwidth of the input signal X(t) (e.g., oversampling), and the digital output Y(n) is then provided to a digital filter and decimation system 106 and to a first DAC 108. The exemplary first A/D converter 104 is a flash ADC providing a 5-level (e.g., 3 bit) thermometer coded first digital output Y(n) representative of the system analog input X(t), although any digital-to-analog converter or quantizer type may be employed within the scope of the invention. The system 106 reduces undesirable noise in the digital signal Y(n) and performs decimation by resampling the signal Y(n) at a lower rate to remove redundant signal information introduced by the oversampling process to provide the multi-bit system digital output $D_{OUT}$ representative of the system analog input. The digital decimation system 106 may be constructed using any digital logic and/or analog circuitry within the scope of the invention.

The system 100 further comprises a noise shaping system 110 that provides second order noise shaping for a quantization error associated with the first A/D converter 104. The noise shaping system 110 is coupled to the first A/D converter 104 and provides a first analog feedback signal W(t) to the summer 102 according to the first digital output Y(n), wherein the feedback signal W(t) is second order noise shaped by the system 110 with respect to the quantization error of the A/D converter 104. In accordance with the invention, the noise shaping system 110 has only one integrator amplifier, and digital error feedback is employed in noise shaping the quantization errors.

The noise shaping system 110 comprises the first DAC 108 that provides an analog first DAC output according to the first digital output Y(n), as well as a delta sigma modulator 112 coupled with the first DAC 108 and a digital error feedback system 114. The delta sigma modulator 112 is a first order modulator that quantizes the quantization noise created by the first A/D converter 104, in the form of a second digital output U(k), which can then be operated on with a digital domain noise-shaping transfer function H(z) in the digital error feedback system 114. This approach provides second order noise shaping without requiring two integrator amplifiers, as was the case in conventional second order delta sigma converters (e.g., FIG. 1 above).

The exemplary first order delta sigma modulator 112 comprises an adder/integrator including a summing junction or node 112a and a first order integrator 112b coupled with the first DAC 108, wherein the integrator 112b has only a single integrator amplifier. The modulator 112 further comprises a second A/D converter 112c quantizing the output of the integrator, and a second DAC 112d converting the second digital output U(k) to analog form as an internal feedback signal. The adder/integrator 112a, 112b, as well as the second A/D converter 112c and the second DAC 112d are implemented as switched capacitor circuits in the exemplary system 100, although these may alternatively be constructed using any suitable circuits or subsystems within the scope of the present invention.

The integrator 112b provides an analog integrator output according to the first DAC output, according to the system analog input X(t), according to the first analog feedback signal W(t), and according to an analog modulator feedback signal from the second DAC 112d. The second A/D converter 112c is coupled with the integrator 112b and provides the second digital output U(k) according to the integrator output. Within the first order delta sigma modulator 112, the integrator output signal is first order noise shaped by the integrator 112b with respect to the quantization error of the second A/D converter 112c. In order to further noise shape the quantization error of the second A/D converter 112c, the noise shaping system 110 further comprises the error feedback system 114 and an analog delay system or circuit 116, such as a switched capacitor circuit or other system that provides a delayed integrator output feedback signal to the first A/D converter 104 via the summing node 102.

The digital error feedback system 114 is coupled with the delta sigma modulator 112 to receive the second digital output U(k), and is also coupled with the summing node 102 to provide the first analog feedback signal W(t) according to the second digital output U(k). The feedback signal W(t) is digitally noise shaped by the system 114 to the second order with respect to the quantization error of the delta sigma modulator 112, including the quantization error of the second A/D converter 112c thereof. The exemplary digital error feedback system 114 comprises a digital signal processing (DSP) system 114a coupled with the delta sigma modulator 112 and a third DAC 114b coupled with the first A/D converter 104 through the summer 102. This advantageously provides $N^{th}$ order noise shaping in the system 100 without the addition of integrator amplifiers, whereby low power operation is facilitated.

The DSP system 114a can be implemented using any suitable digital and sequential logic or other components within the scope of the invention, that provide a third digital output to the DAC 114b according to the second digital output, which is second order noise shaped with respect to the quantization error of the modulator 112. The third DAC 114b, in turn, provides the first analog feedback signal W(t) according to the third digital output from the DSP system 114a.

In the exemplary system 100 of FIG. 2A, the DSP 114a provides digital first order filtering or noise shaping of the second digital output U(k) via a transfer function H(z) 120 in parallel with a digital domain delay operator $(1-z^{-1})$ 122, where the outputs of the functions 120 and 122 are provided to a summer 124 along with an internal feedback output from a feedback function $z^{-1}H(z)$ 126. As discussed further below with respect to the simulation results in FIGS. 3A–6, the noise shaping transfer function H(z) is implemented as a second order low pass filter in the exemplary system 100, although any $N^{th}$ order noise shaping transfer function may be implemented within the scope of the invention.

The output of the summer 124 is quantized by a third quantizer 128, in this case, a digital-to-digital quantizer that is implemented in the DSP 114a, the output of which is provided to a summer 130 that subtracts the digital-to-digital quantizer input and provides an error input to the $z^{-1}H(z)$ feedback function 126. Although schematically illustrated as various functional blocks in FIG. 2A, the illustrated functions in the DSP system 114a may be implemented by any suitable sequential and or combinational logic within the scope of the invention.

Although the exemplary analog-to-digital conversion system 100 is a second order design, the invention is applicable to A/D systems of any order N, wherein the modulator 112 has N–1 or fewer integrator amplifiers, and where N is a positive integer greater than 1. In general, multiple order A/D conversion systems in accordance with the invention may comprise a plurality of integrators in the modulator 112 serially coupled between the modulator input signals from the summer 112a and the second A/D converter 112c, as well as a plurality of DAC converters 112d, with individual DACs 112d being coupled with the A/D converter 112c and a corresponding one of the plurality of integrators. Alternatively, a single DAC converter 112d may provide multiple feedback signals in a multiple order sigma delta modulator 112.

In the exemplary system 100, all the DACs and A/D converters are 5 level thermometer coded devices (e.g., 3 bits), although single bit (e.g., two-level) or other configurations are possible within the scope of the invention. The sigma delta modulator 112 operates to oversample the analog output of the summer 112a (e.g., oversampling the quantization error of the first A/D converter 104), wherein the digital signal U(k) is an oversampled 5 level thermometer coded second digital output, effectively having 16 to 32 bits in one implementation. If the oversampled output U(k) were itself provided to the third DAC 114b, the DAC 114b would need to be large and complex, having a significant number of switching components. In the exemplary system 100, however, the third quantizer 128 and the function $z^{-1}H(z)$ 126 operate to sigma delta modulate the output of the noise shaping function H(z) 120, wherein the output of the third quantizer 128 is also a 5 level thermometer coded signal, making the design of the DAC 114b relatively small. Thus, the noise shaping functions are provided by the integrator 112b having a single integrator amplifier, and also through digital processing in the error feedback system 114, by which $N^{th}$ order noise shaping is accomplished using fewer than N integrator amplifiers.

Figure 2C:
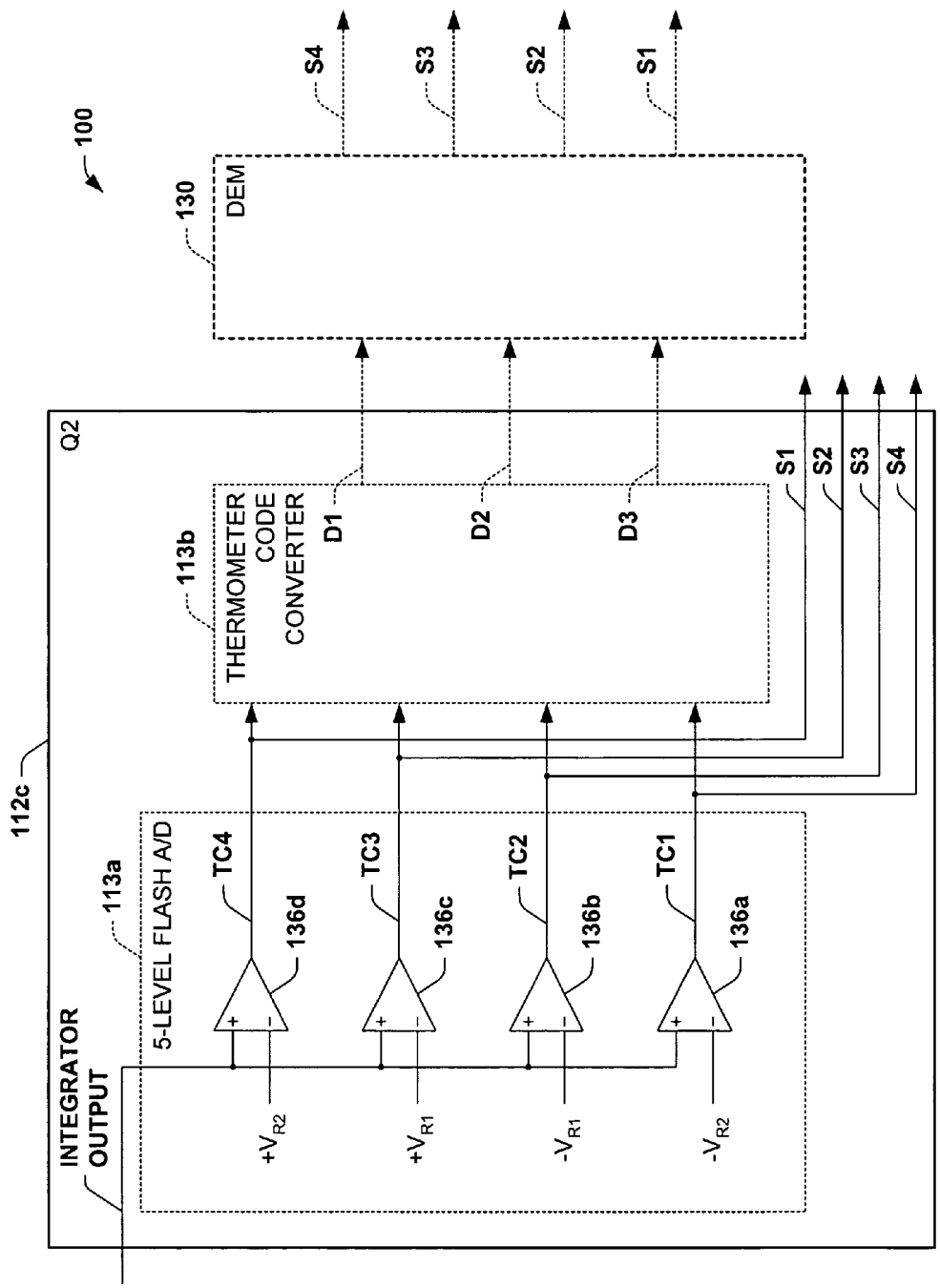
Figure 2D:
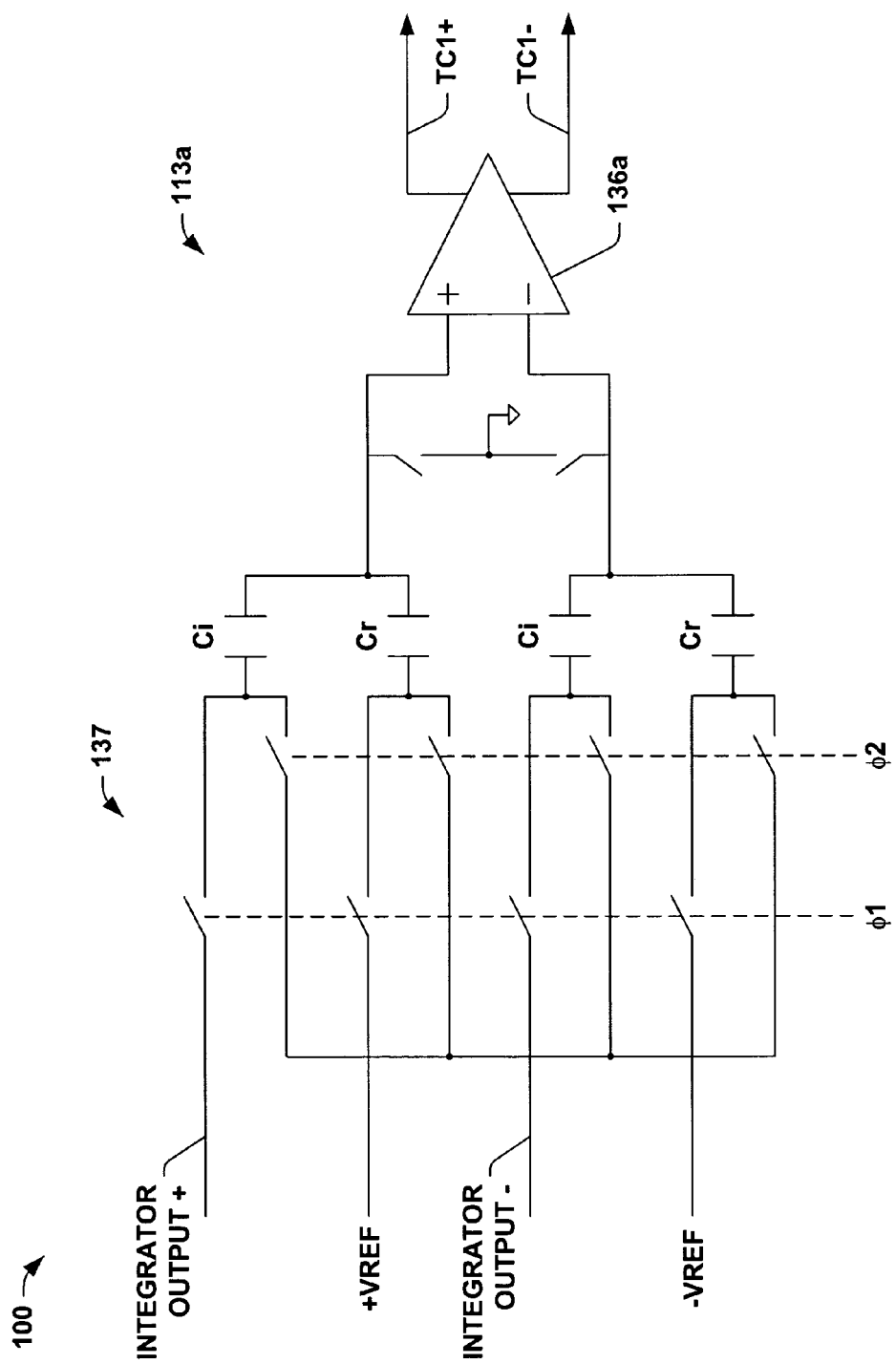
Figure 2E:
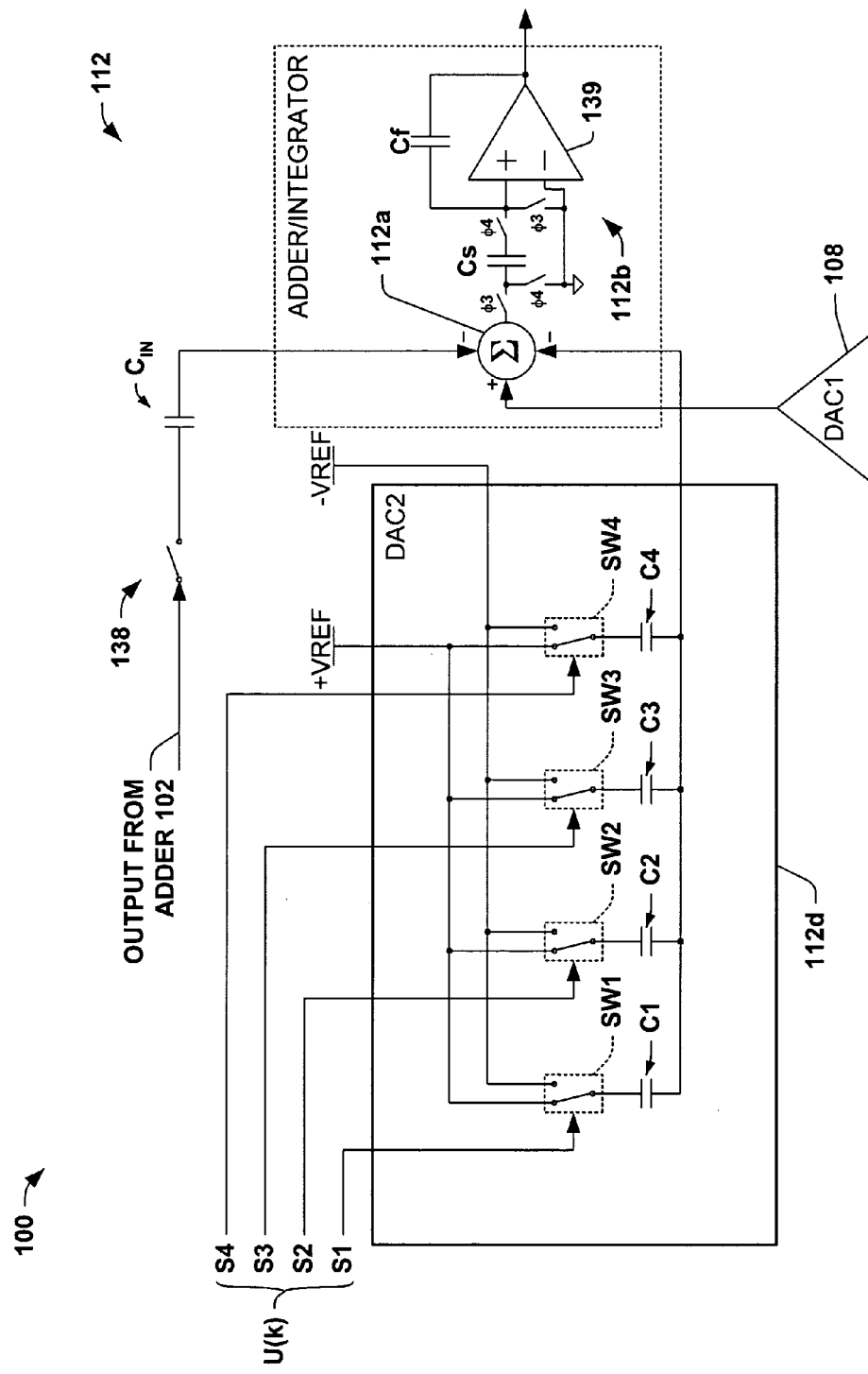

Referring also to FIGS. 2C–2E, the DACs 108, 112d, and 114b, the A/D converters 104 and 112c, the summers 102 and 112a, the delay circuit 116, and the integrator 112b are implemented using switched capacitor circuits in the exemplary system 100, although these may alternatively be implemented using other components and circuit types within the scope of the invention. Furthermore, one or more of the switched capacitor circuits can be implemented using dynamic element matching (DEM) systems to vary the selection of capacitors, in order to improve system linearity. In this way, the adverse effects of component value deviations (e.g., capacitance mismatch) can be mitigated.

FIGS. 2C and 2D illustrate further details of the exemplary second A/D converter 112c in the modulator 112, which is essentially the same as the first A/D converter 104 in the system 100. The A/D converter 112c comprises a 5-level flash A/D converter 113a that receives the analog integrator output from the integrator 112b, and provides thermometer coded output signals TC1–TC4 representing five levels (e.g., 0000, 0001, 0011, 0111, and 1111) between a negative reference voltage –VREF and a positive reference voltage +VREF. The thermometer coded signals TC1–TC4 are generated using four comparators 136a–136d having positive inputs coupled with the integrator output and negative terminals coupled with four voltage levels +/–$V_{R1}$ and +/–$V_{R2}$ between –VREF and +VREF. In the illustrated implementation, the thermometer coded signals TC1–TC4 are provided directly to the second DAC 112d as the second digital output select signals S1–S4 (e.g., U(k)).

Alternatively, the signals TC1–TC4 can be provided to a thermometer code converter 113b, which generates binary digital output signals D1, D2, and D3 that may be provided to a binary DAC. In another possible implementation, the thermometer coded signals TC1–TC4 (e.g., or the binary signals D1–D3) may be provided to a dynamic element matching (DEM) system 130, which varies or randomizes the signals according to a DEM algorithm, such as individual level averaging (ILA), group level averaging (GLA), etc., to generate the DAC component select signals S1–S4. Further, the conversion of the thermometer code to the digital output may alternatively be performed in the DEM system 130.

FIG. 2D illustrates a portion of the flash A/D 113a, showing a differential implementation of one of the comparator stages in conjunction with a switched capacitor circuit. The switched capacitor circuit for the first comparator 136a includes sets of switches 137 (e.g., transistors, etc.) controlled by two phased signals $\phi 1$ and $\phi 2$, along with a pair of identically sized input capacitors Ci and a pair of identically sized reference capacitors Cr, where the phase signals $\phi 1$ and $\phi 2$ are derived from the sampling frequency $F_S$ of the modulator 112. The differential integrator output signals (e.g., plus and minus) are provided to the switches 137 along with positive and negative references +VREF and –VREF, respectively. By controlling the switching components 137, the capacitors are selectively charged and discharged to provide a comparison between the output from the integrator 112b and the reference voltage level –$V_{R2}$, wherein the voltage level –$V_{R2}$ is derived from the references –VREF and +VREF. Similar switched capacitor circuits are constructed around the other comparators 136b–136d in the exemplary A/D converter 112c.

Although illustrated and described in the context of switched capacitor circuits and flash A/D configurations, any A/D converter may be used within the scope of the invention, including non-flash A/Ds and converters that do not employ switched capacitor circuits. In addition, one, some or all of the DACs, A/D converters, and or the adder/integrator, if implemented with switched capacitors, may include DEM circuits or systems within the scope of the invention. Moreover, while the exemplary A/D converters and DACs in the conversion system 100 are multi-level (e.g., multi-bit), single bit devices may alternatively be employed, wherein all such variant implementations are contemplated as falling within the scope of the invention.

FIG. 2E illustrates an exemplary switched capacitor implementation of the second DAC 112d providing the feedback signal to the adder/integrator 112a, 112b. The exemplary DAC 112d is a switched capacitor converter, comprising switch components (e.g., transistors) SW1–SW4 and capacitors C1–C4. The switching elements SW1–SW4 selectively couple the capacitors C1–C4 with a positive reference voltage +VREF or a negative reference voltage –VREF according to the second digital output U(k), which in this example is the switching selection signals S1–S4 from the flash A/D 113*a* in FIG. 2C (e.g., or from the DEM system 130). In the exemplary DAC 112*d*, the capacitor elements C1–C4 are of similar values, such as having the same design capacitance value, wherein the individual capacitances may vary within a tolerance amount of the design capacitance value. Alternative implementations are possible, for example, wherein the capacitors C1–C4 are not of the same design value, such as weighted designs in which the values of the elements are designed to be multiples of one another. For instance, alternative designs are possible within the scope of the invention in which the design value of C2 is twice that of C1, C3 is designed to be four times the value of C1, C4 is designed to be eight times the value of C1, etc., which may be used in conjunction with a binary digital output U(k).

In the exemplary DAC 112*d*, the analog feedback signal is generated through selective charging of the capacitors C1–C4 according to the switching selection signals S1–S4, wherein the switches SW1–SW4 selectively couple the capacitors C1–C4 with one of the supply voltages −VREF or +VREF so as to provide the analog feedback signal generally corresponding to the second digital output U(k). The charge on the capacitors is then summed at the summing junction 112*a* with the charge corresponding to the sampled output from the adder 102 (FIGS. 2A and 2B) and that from the output of the first DAC 108, wherein relative input and feedback gains may be established according to the relative values of an input capacitance $C_{IN}$ and the DAC capacitances C1–C4. The resulting charge is an error signal and is then provided to the integrator filter 112*b*.

Similar switched capacitor circuitry may be incorporated into a single circuit to implement the first DAC 108, wherein the capacitors thereof are selected according to the first digital output Y(n), which may likewise be thermometer coded. The exemplary integrator 112*b* is implemented as a switched capacitor circuit with a single integrator amplifier 139 (e.g., operational amplifier) having one or more feedback capacitors Cf and a sampling capacitor Cs and switching components operated according to signals φ3 and φ4 that are also derived from the sampling frequency Fs of the modulator 112. Moreover, in the exemplary system 100, the third DAC 114*b* and the first adder (e.g., summing junction) 102 are implemented at the input of the first A/D converter 104 and the first and second DACs 108 and 112*d*, respectively, are implemented together with the adder 112*a* at the input of the integrator 112*b*.

Referring now to FIGS. 2A and 2B, in accordance with the invention, a digital domain error feedback noise shaping is introduced in the DSP 114*a* to shape the output of H(z) and also to reduce the number of possible digital signal levels from the oversampled modulator 112, wherein the functions H(z) 120, (1−z$^{-1}$) 122, z$^{-1}$H(z) 126, and the third quantizer 128 are implemented completely in the digital domain. It is noted with respect to the integrator 112*b* and the analog delay system 116, that while these are shown in FIG. 2A as having z-domain (e.g., digital domain) transfer functions, that these are implemented in analog (e.g., switched capacitor) circuits in the exemplary analog-to-digital conversion system 100.

In order to determine the noise transfer functions (NTF) of the system 100, linear representation are used for the quantizers 104, 112*c*, and 128, which are modeled as additive noises with unity gain. The ideal transfer function for the delayed switched capacitor integrator 112*b* is:

$$H_{int}(z) = \frac{z^{-1}}{1-z^{-1}}. \tag{1}$$

As shown in FIG. 2A, the second digital output U(k) from the second A/D converter 112*c* (e.g., U(z)) can be written in terms of E1, the quantization noise of the first A/D converter 104, as:

$$U(z)=z^{-1}E_1(z)+(1-z^{-1})E_2(z), \tag{2}$$

where E2 is the quantization noise related to Q2. Similarly, the output of the third quantizer 128 can be represented as a function of U(z) as:

$$W(z)=U(z)H(z)-(1-z^{-1})U(z)+(1-z^{-1}H(z))E_3(z), \tag{3}$$

where E3 is the quantization noise associated with the third quantizer 128. In addition, the first digital output Y(N) of the first A/D converter 104 (e.g., Y(z)) is represented as:

$$Y(z)=X(z)-W(z)+(1-z^{-1})E_1(z)+z^{-1}U(z). \tag{4}$$

By substituting these equations, the first digital output Y(z) can be rewritten in terms of the quantization noises and the digital transfer function, H(z), as:

$$Y(z)=X(z)+(1-z^{-1}H(z))E_1(z)++(1-z^{-1})(1-H(z))E_2(z)+ \\ (1-z^{-1}H(z))E_3(z), \tag{5}$$

thereby indicating that all of the noise transfer functions are tuned by the digital transfer function. In one example, H(z) can be implemented in the DSP system 114*a* as:

$$H(z) = \frac{2-z^{-1}}{2-2z^{-1}+z^{-2}}, \tag{6}$$

in which case the noise-transfer-functions are determined as:

$$NTF_1(z) = NTF_3(z) = 1 - z^{-1}H(z) = \frac{(1-z^{-1})^2}{1-z^{-1}+\frac{1}{2}z^{-2}}, \text{ and} \tag{7}$$

$$NTF_2(z) = (1-z^{-1})(1-H(z)) = \frac{-z^{-1}(1-z^{-1})^2}{2\left(1-z^{-1}+\frac{1}{2}z^{-2}\right)}, \tag{8}$$

where NTF1, NTF2, and NTF3 are the noise transfer functions for the quantization noises E1, E2, and E3, respectively. Thus, the system 100 provides a second order noise shaping system, wherein all of the noise transfer functions have two DC zeros and two imaginary poles located at Fs/8 and inside the unit circle. In this regard, the system 100 provides second order quantization error noise shaping using a single integrator amplifier 139 (FIG. 2E).

FIGS. 3A–6 illustrate simulation curves for the exemplary analog-to-digital conversion system 100, including ideal performance results, as well as results for a circuit level non-ideal model for the system 100. For the simulation, these non-ideal model elements were employed in the circuit implementation of FIG. 2B. In the non-ideal simulations, the non-idealities of the various circuit components were modeled in a Matlab/Simulink environment allowing time-domain behavioral simulations, wherein the simulation accounted for parasitic effects in switched capacitor circuits, such as sampling jitter, and kT/C noise. In addition, the simulation accounted for operational amplifier parameters (e.g., integrator amplifier 139 in FIG. 2E), including white noise, finite DC gain, finite bandwidth, slew rate, and saturation voltages associated with the sole integrator amplifier in the integrator 112b. The simulated non-idealities of the integrator 112b included incomplete charge transfer at the integrator 112b.

Thermal switch noise was also incorporated in the non-ideal circuit simulations, which is generated by random fluctuation of carriers due to thermal energy, having a white spectrum and wide band, and which is controlled by the characteristics of the sampling capacitor (e.g., $C_{IN}$ and Cs in FIG. 2E). Since it is an accumulative noise, each sampling branch at the input of the real integrator 112b was modeled with contributing kT/C noise elements contributing to the total noise power depending on a coefficient factor at the branch. Also modeled were mismatches at the quantization levels, harmonic distortion at the amplifier 139, and gain errors. For instance, mismatches in the capacitor values in a CMOS process result in inaccurate quantization levels. Fortunately, all the gains and quantization levels of the flash A/D converters of the system 100 are based on the ratio of capacitors and not on the absolute value. Therefore, a typical mismatch is usually in a range of about 1 or 2%. Due to nonlinearity, a typical switched capacitor amplifier generates harmonic distortion, wherein a differential implementation eliminates the even order harmonics. In this case, therefore, the third harmonic was expected to be the most dominant distortion component.

Figure 3A:
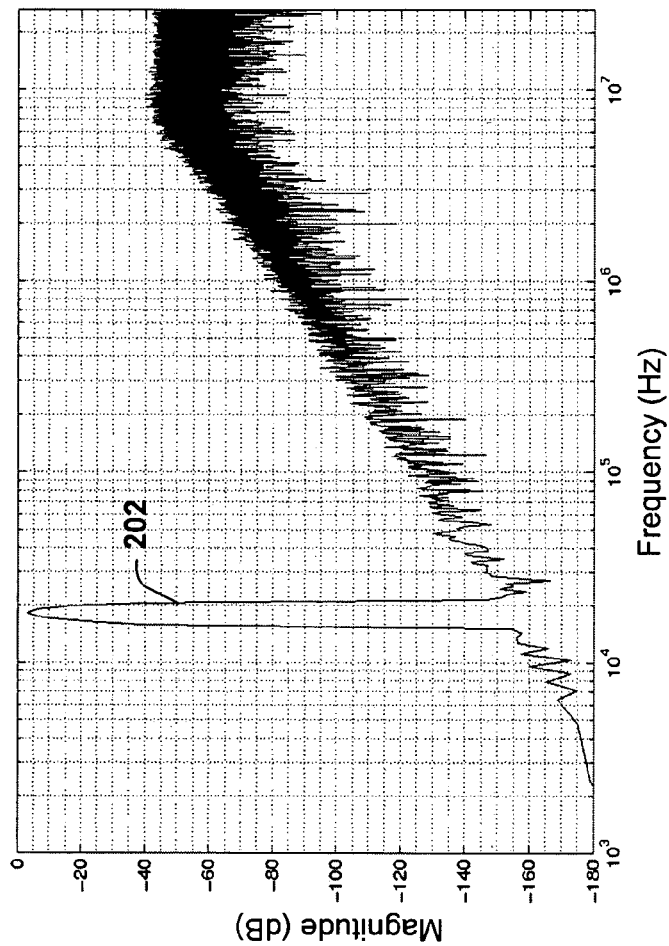
FIGS. 3A–4 are magnitude vs. frequency plots illustrating ideal and non-ideal simulation results for the exemplary delta sigma analog-to-digital conversion system of FIGS. 2A–2E.
Figure 3B:
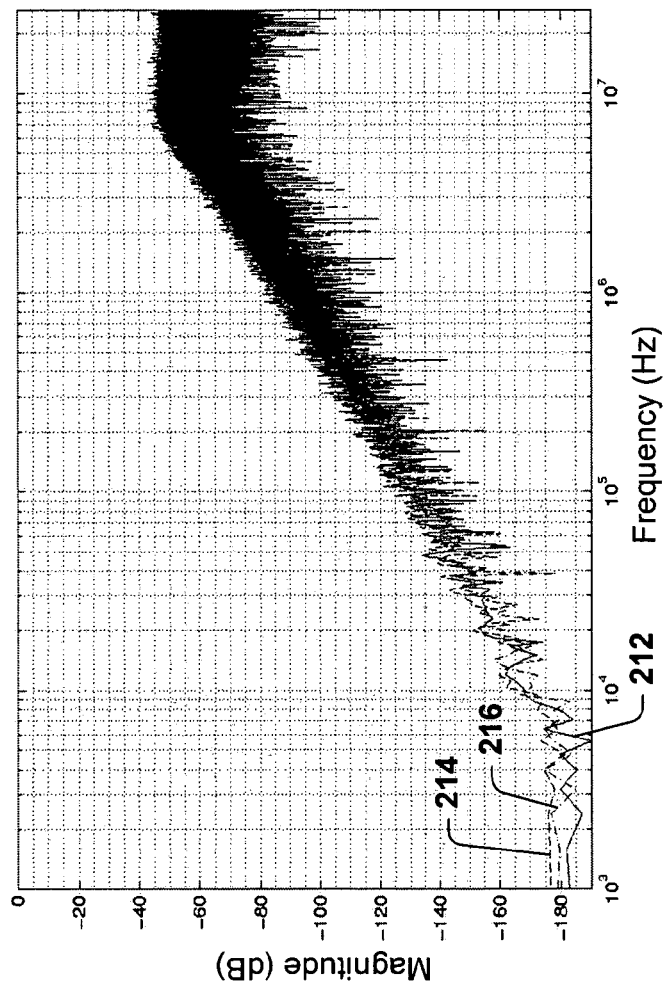

FIG. 3A illustrates an ideal 217 point fast Fourier transform (FFT) simulation plot 200 (e.g., magnitude vs. frequency) showing a curve 202 of the modulator first quantized out output Y(n) 210 for an 18 kHz (−3 dB) input signal X(t) at the maximum signal amplitude at which the system 100 remains stable. In this simulation, all the system components were modeled as ideal, with no component mismatch in the DACs or the integrator 112b, wherein the plot 200 shows the second-order noise shaping that is obtained from the system 100. A plot 210 in FIG. 3B separately illustrates the three quantization noise sources 212 (first A/D converter 104), 214 (second A/D converter 112c), and 216 (third quantizer 128) modeled for the ideal system 100. As can be seen in FIG. 3B, the quantization noises associated with the three quantizers are all shaped at second order (e.g., as shown in equations 7 and 8 above). Thus, no one individual quantization noise dominates the others, due to the digital error feedback arrangement in the system 100.

Simulations were also performed which incorporated the non-ideal behaviors of the circuits in the system 100. In these non-ideal simulations, two different sets of values were used for these non-ideal effects, illustrated as Noise Level 1 and Noise Level 2 in the following Table 1. The amplifier 139 was simulated having a low frequency gain of 70 dB, a saturation voltage of 1.5V, an 80 MHz bandwidth, and a slew rate of 75 V/usec, wherein third harmonic distortion was simulated at −70 dB below input level.

TABLE 1

|  | Noise Level 1 | Boise Level 2 |
| --- | --- | --- |
| Gain Error | 0.25% | 1% |
| Quantization Level Mismatch | 0.5% | 2% |

TABLE 1-continued

|  | Noise Level 1 | Boise Level 2 |
| --- | --- | --- |
| Sampling Cap Size for kT/C Noise | 5 pF | 2 pF |
| Op-Amp rms Noise | 50 uV | 100 uV |

Figure 4:
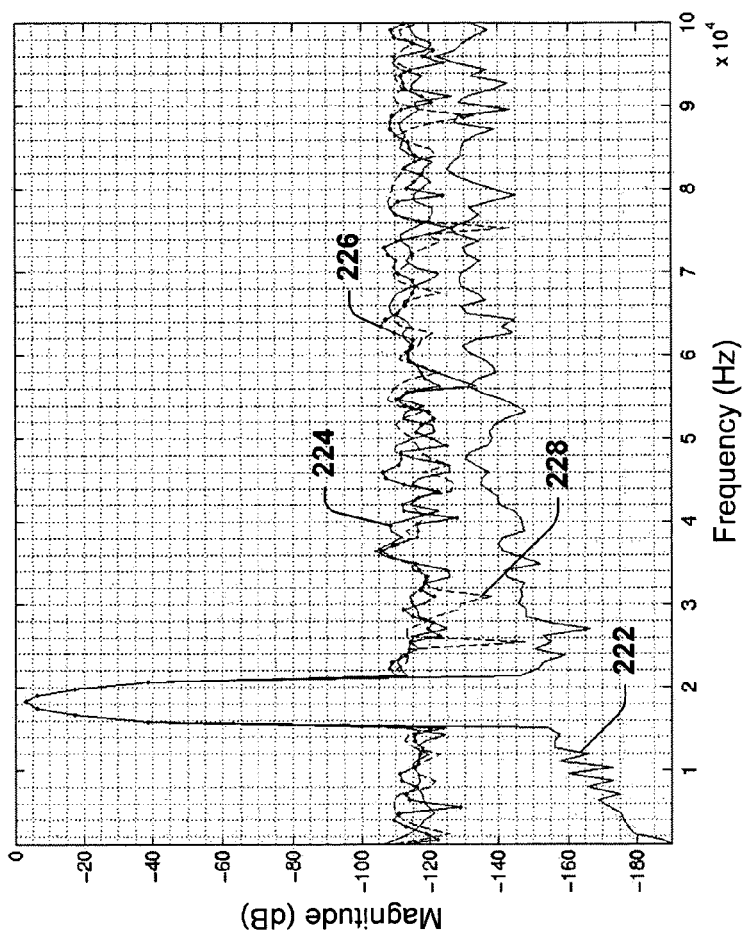

FIG. 4 shows the power spectrum plot 220 (magnitude vs. frequency) of the signal in the band of interest for GSM applications. A solid curve 222 is illustrated corresponding to the ideal simulation of FIG. 3A, which has the lowest noise floor. The other curves 224, 226, and 228 were obtained by simulation using Noise Level 1, Noise Level 2, and the above mentioned non-ideal amplifier 139, respectively, wherein the noise floor remains at around −100 dB in all cases with a very weak second harmonic distortion.

Figure 5:
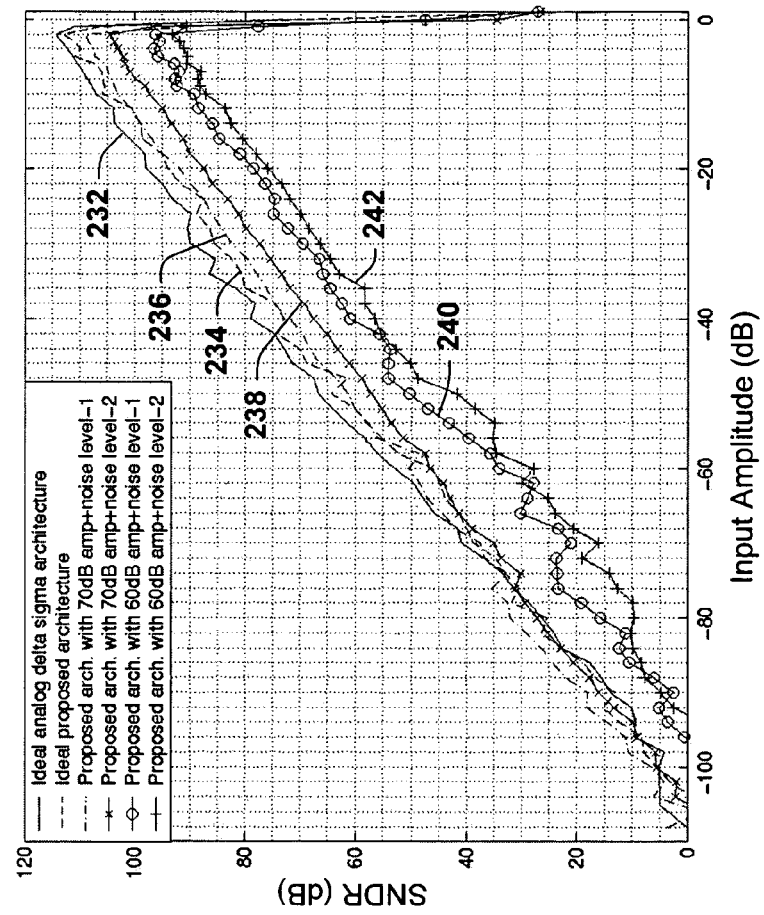
FIGS. 5 and 6 are signal-to-noise plus distortion ratio (SNDR) plots illustrating ideal and non-ideal simulation results for the exemplary delta sigma analog-to-digital conversion system of FIGS. 2A–2E.
Figure 6:
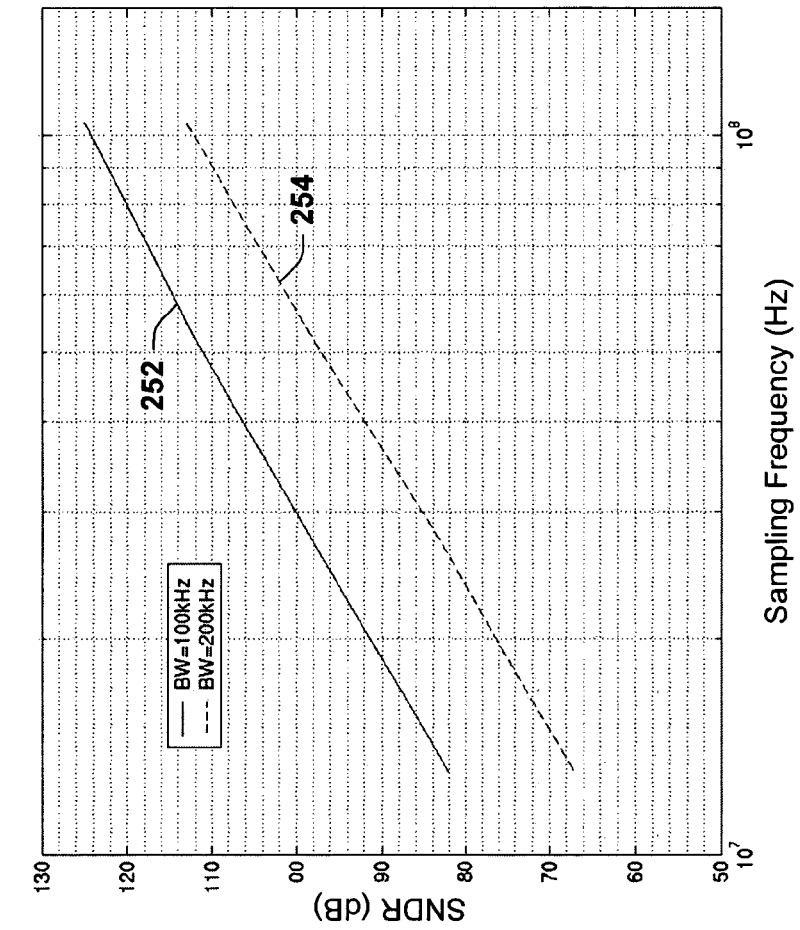

FIG. 5 shows a signal-to-noise plus distortion ratio (SNDR) vs. input amplitude plot 230 for six different simulations, in which the low frequency gain of the amplifier 139, as well as the noise levels associated with various noise sources in the system, were varied for a signal band of 100 kHz and an oversampling ratio (OSR) of 96. The solid curve 232 illustrates the ideal simulation of an ideal second order modulator with 5 levels of quantization in its feedback, where the noise transfer function is implemented entirely in the analog domain with ideal amplifiers and no noise. The dashed curve 234 corresponds to the ideal simulation of the system 100 (e.g., FIG. 3A above). The remaining four curves 236–242 are simulation results for the system 100 with different combinations of the amplifier low frequency gain and the noise levels of Table 1. Curves 236 and 238 correspond to an integrator amplifier 139 with a low frequency gain of 70 dB simulated using Noise Level 1 and Noise Level 2, respectively. Curves 240 and 242 correspond to a low frequency amplifier gain of 60 dB simulated using Noise Level 1 and Noise Level 2, respectively. FIG. 6 illustrates a comparative plot 250 showing SNDR vs. sampling frequency curves 252 and 254 for the system 100, in which bandwidths of 100 kHz and 200 kHz are provided, respectively.

As shown in FIG. 5, for a given set of amplifier parameters, particularly at large input signal amplitudes, approximately 4 dB of SNDR is sacrificed between Noise Level 1 and Noise Level 2 (e.g., comparing curves 236 and 238 (70 dB amplifier 139) or comparing curves 240 and 242 (60 dB amplifier 139)). It is noted however, that for a given noise level (e.g., comparing curves 236 and 240 (Noise Level 1) or comparing curves 238 and 242 (Noise Level 2)), approximately 13 dB is lost between the cases where the amplifier low frequency gain is varied from 70 dB to 60 dB. Thus, the simulations of FIG. 5 show that the system 100 is very tolerant of different sources of non-idealities. In addition, these results show that the system performance is more dependent on the performance of the amplifier 139 than on the non-idealities and noise levels. In this regard, the amplifier parameters employed in the simulations are typical of the amplifiers designed for high-speed applications in wireless systems, wherein the results are believed to be typical of those obtainable in various implementations of the exemplary system 100 and other systems within the scope of the invention.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An analog-to-digital conversion system, comprising:
   a first A/D converter providing a first digital output according to a system analog input and according to a noise shaped first analog feedback signal; and
   a noise shaping system with respect to quantization noise associated with said converter of an order N having less than N integrator amplifiers, the noise shaping system being coupled to the first A/D converter and providing the first analog feedback signal according to the first digital output, the first analog feedback signal being noise shaped by the noise shaping system to an order N with respect to a quantization error associated with the first A/D converter, wherein N is an integer greater than 1.

2. The analog-to-digital conversion system of claim 1, wherein N=2.

3. The analog-to-digital conversion system of claim 2, wherein the first A/D converter is a flash analog-to-digital converter.

4. The analog-to-digital conversion system of claim 2, wherein the first A/D converter is a flash ADC providing a thermometer coded first digital output representative of the system analog input.

5. The analog-to-digital conversion system of claim 2, further comprising a digital decimation filter coupled with the first A/D converter and providing a multi-bit digital output according to the first digital output, the multi-bit digital output being representative of the system analog input.

6. The analog-to-digital conversion system of claim 2, wherein the noise shaping system comprises:
   a first DAC coupled with the first A/D converter, the first DAC providing an analog first DAC output according to the first digital output;
   a delta sigma modulator coupled with the first DAC, the delta sigma modulator providing a second digital output according to a difference between the first DAC output and the system analog input; and
   a digital error feedback system coupled with the delta sigma modulator, the digital error feedback system providing the first analog feedback signal to the first A/D converter according to the second digital output, the first analog feedback signal being noise shaped by the digital error feedback system to order N with respect to a quantization error associated with the delta sigma modulator.

7. The analog-to-digital conversion system of claim 6, wherein the delta sigma modulator comprises:
   an integrator of order N−1 coupled with the first DAC, the integrator providing an analog integrator output according to the first DAC output, according to the system analog input, according to the first analog feedback signal, and according to an analog modulator feedback signal, the integrator having less than N integrator amplifiers;
   a second A/D converter coupled with the integrator, the second A/D converter providing a second digital output according to the integrator output; and
   a second DAC coupled with the second A/D converter, the second DAC providing the modulator feedback signal to the integrator according to the second digital output;
   wherein the integrator output is noise shaped by the integrator to an order N−1 with respect to a quantization error associated with the second A/D converter.

8. The analog-to-digital conversion system of claim 7, wherein the noise shaping system further comprises an analog delay system coupled with the integrator and with the first A/D converter, the analog delay system providing an analog delayed integrator output signal to the integrator and to the first A/D converter.

9. The analog-to-digital conversion system of claim 7, wherein the digital error feedback system comprises:
   a digital signal processing system coupled with the delta sigma modulator, the digital signal processing system providing a third digital output according to the second digital output, the third digital output being noise shaped by the digital signal processing system to order N with respect to a quantization error associated with the delta sigma modulator; and
   a third DAC coupled with the digital signal processing system, the third DAC providing the first analog feedback signal to the first A/D converter according to the third digital output.

10. The analog-to-digital conversion system of claim 9, wherein at least one of the first DAC, the second DAC, and the third DAC comprises:
    a switched capacitor system comprising a plurality of selectable capacitors providing an analog output corresponding to a digital input code using DAC elements selected according to the digital input code; and
    a dynamic element matching system coupled with the switched capacitor system, wherein the dynamic element matching system varies the selection of capacitors.

11. The analog-to-digital conversion system of claim 6, wherein the digital error feedback system comprises:
    a digital signal processing system coupled with the delta sigma modulator, the digital signal processing system providing a third digital output according to the second digital output, the third digital output being noise shaped by the digital signal processing system to order N with respect to a quantization error associated with the delta sigma modulator; and
    a third DAC coupled with the digital signal processing system, the third DAC providing the first analog feedback signal to the first A/D converter according to the third digital output.

12. The analog-to-digital conversion system of claim 1, wherein the noise shaping system comprises:
    a first DAC coupled with the first A/D converter, the first DAC providing an analog first DAC output according to the first digital output;

a delta sigma modulator coupled with the first DAC, the delta sigma modulator providing a second digital output according to a difference between the first DAC output and the system analog input; and a digital error feedback system coupled with the delta sigma modulator, the digital error feedback system providing the first analog feedback signal to the first A/D converter according to the second digital output, the first analog feedback signal being noise shaped by the digital error feedback system to order N with respect to a quantization error associated with the delta sigma modulator.

13. The analog-to-digital conversion system of claim 12, wherein the delta sigma modulator comprises:

an integrator of order N−1 coupled with the first DAC, the integrator providing an analog integrator output according to the first DAC output, according to the system analog input, according to the first analog feedback signal, and according to an analog modulator feedback signal, the integrator having less than N integrator amplifiers;

a second A/D converter coupled with the integrator, the second A/D converter providing a second digital output according to the integrator output; and a second DAC coupled with the second A/D converter, the second DAC providing the modulator feedback signal to the integrator according to the second digital output;

wherein the integrator output is noise shaped by the integrator to an order N−1 with respect to a quantization error associated with the second A/D converter.

14. The analog-to-digital conversion system of claim 13, wherein the noise shaping system further comprises an analog delay system coupled with the integrator and with the first A/D converter, the analog delay system providing an analog delayed integrator output signal to the integrator and to the first A/D converter.

15. The analog-to-digital conversion system of claim 13, wherein the digital error feedback system comprises:

a digital signal processing system coupled with the delta sigma modulator, the digital signal processing system providing a third digital output according to the second digital output, the third digital output being noise shaped by the digital signal processing system to order N with respect to a quantization error associated with the delta sigma modulator; and a third DAC coupled with the digital signal processing system, the third DAC providing the first analog feedback signal to the first A/D converter according to the third digital output.

16. The analog-to-digital conversion system of claim 15, wherein at least one of the first DAC, the second DAC, and the third DAC comprises:

a switched capacitor system comprising a plurality of selectable capacitors providing an analog output corresponding to a digital input code using DAC elements selected according to the digital input code; and a dynamic element matching system coupled with the switched capacitor system, wherein the dynamic element matching system varies the selection of capacitors.

17. The analog-to-digital conversion system of claim 12, wherein the digital error feedback system comprises:

a digital signal processing system coupled with the delta sigma modulator, the digital signal processing system providing a third digital output according to the second digital output, the third digital output being noise shaped by the digital signal processing system to order N with respect to a quantization error associated with the delta sigma modulator; and a third DAC coupled with the digital signal processing system, the third DAC providing the first analog feedback signal to the first A/D converter according to the third digital output.

18. A noise shaping system for providing a noise shaped first analog feedback signal to a first A/D converter in an analog-to-digital conversion system, the noise shaping system comprising:

a first DAC coupled with the first A/D converter, the first DAC providing an analog first DAC output according to a first digital output;

a delta sigma modulator coupled with the first DAC, the delta sigma modulator providing a second digital output according to a difference between the first DAC output and a system analog input; and a digital error feedback system coupled with the delta sigma modulator, the digital error feedback system providing the first analog feedback signal to the first A/D converter according to the second digital output.

19. The noise shaping system of claim 18, wherein the delta sigma modulator comprises less than N integrator amplifiers, and wherein the first analog feedback signal is noise shaped to order N with respect to a quantization error associated with the first A/D converter, wherein N is an integer greater than 1.

20. The noise shaping system of claim 18, wherein the delta sigma modulator comprises:

an integrator coupled with the first DAC, the integrator providing an analog integrator output according to the first DAC output, according to the system analog input, according to the first analog feedback signal, and according to an analog modulator feedback signal, the integrator having N−1 integrator amplifiers;

a second A/D converter coupled with the integrator, the second A/D converter providing a second digital output according to the integrator output; and a second DAC coupled with the second A/D converter, the second DAC providing the modulator feedback signal to the integrator according to the second digital output;

wherein the integrator output is noise shaped by the integrator to an order N-1 with respect to a quantization error associated with the second A/D converter.

21. The noise shaping system of claim 20, wherein the noise shaping system further comprises an analog delay system coupled with the integrator and with the first A/D converter, the analog delay system providing an analog delayed integrator output signal to the integrator and to the first A/D converter.

22. The noise shaping system of claim 20, wherein the digital error feedback system comprises:

a digital signal processing system coupled with the delta sigma modulator, the digital signal processing system providing a third digital output according to the second digital output, the third digital output being noise shaped by the digital signal processing system to order N with respect to a quantization error associated with the delta sigma modulator; and a third DAC coupled with the digital signal processing system, the third DAC providing the first analog feedback signal to the first A/D converter according to the third digital output.

23. A noise shaping system of an order N for providing a noise shaped analog feedback signal to a first A/D converter in an analog-to-digital conversion system, the noise shaping system comprising:
- a DAC receiving a first digital output from the first A/D converter, the DAC providing an analog DAC output according to the first digital output;
- a second A/D converter coupled with the DAC, the second A/D converter comprising less than N integrator amplifiers and providing a second digital output according to a difference between the DAC output and a system analog input, N being an integer greater than 1; and
- a digital error feedback system coupled with the second A/D converter, the digital error feedback system providing a noise shaped analog feedback signal to the first A/D converter according to the second digital output, wherein the first analog feedback signal is noise shaped by the digital error feedback system to order N with respect to a quantization error associated with the first A/D converter.

24. A second order noise shaping system for providing a noise shaped analog feedback signal to an A/D converter in an analog-to-digital conversion system, the noise shaping system comprising:
- a second order integrator having a single amplifier; and
- a digital error feedback system comprising a digital signal processing system, the digital error feedback system providing an analog feedback signal to the A/D converter with second order noise shaping with respect to a quantization error associated with the A/D converter.

* * * * *